(12) United States Patent
Ogawa

(10) Patent No.: US 10,166,720 B2
(45) Date of Patent: Jan. 1, 2019

(54) MULTILAYER WIRING BOARD AND MANUFACTURING METHOD FOR THE MULTILAYER WIRING BOARD

(71) Applicant: TOYOTA JIDOSHA KABUSHIKI KAISHA, Toyota-shi, Aichi-ken (JP)

(72) Inventor: Takashi Ogawa, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 102 days.

(21) Appl. No.: 14/716,231

(22) Filed: May 19, 2015

(65) Prior Publication Data

US 2015/0351235 A1 Dec. 3, 2015

(30) Foreign Application Priority Data

May 29, 2014 (JP) .................................. 2014-111182

(51) Int. Cl.
*B29C 65/02* (2006.01)
*B29C 65/00* (2006.01)
(Continued)

(52) U.S. Cl.
CPC ............ *B29C 65/02* (2013.01); *B29C 66/028* (2013.01); *B29C 66/1122* (2013.01);
(Continued)

(58) Field of Classification Search
CPC .......... H05K 1/036; H05K 3/46; B29C 65/02; B29C 66/028; B29C 66/1122;
(Continued)

(56) References Cited

U.S. PATENT DOCUMENTS

| 6,841,028 B2* | 1/2005 | Tsukada ............... A01G 9/1438 156/304.1 |
| 2003/0134100 A1* | 7/2003 | Mao ........................ A61L 27/34 428/304.4 |

(Continued)

FOREIGN PATENT DOCUMENTS

| JP | 2007-019338 A | | 1/2007 |
| JP | 2010068755 A | * | 4/2010 |

(Continued)

OTHER PUBLICATIONS

R. Srinivasan, B. Braren, D.E. Seeger, R.W. Dreyfus, "Photochemical Cleavage of a Polymeric Solid: Details of the Ultraviolet Laser Ablation of Poly(methyl methacrylate) at 193 and 248 nm", Macromolecules 1986, 19, 916-921.*

(Continued)

*Primary Examiner* — Michael N Orlando
*Assistant Examiner* — Elizabeth Bradford
(74) *Attorney, Agent, or Firm* — Oliff PLC

(57) ABSTRACT

A manufacturing method for a multilayer wiring board includes: forming a groove on a surface of a first thermoplastic resin board; forming a modified layer made of resin having a melting point lower than a melting point of resin constituting the first thermoplastic resin board, by applying light to a region of the surface of the first thermoplastic resin board other than a region around the groove; filling the groove of the first thermoplastic resin board with conductive material having fluidity; and bonding a second thermoplastic resin board to the surface of the first thermoplastic resin board, on which the modified layer is formed, by thermocompression bonding.

7 Claims, 3 Drawing Sheets

(51) Int. Cl.
  *C09J 5/06* (2006.01)
  *H05K 3/12* (2006.01)
  *H05K 3/46* (2006.01)
  *B29L 31/34* (2006.01)
  *B29K 105/00* (2006.01)
  *H05K 3/00* (2006.01)

(52) U.S. Cl.
  CPC ............ *B29C 66/41* (2013.01); *B29C 66/723* (2013.01); *B29C 66/73921* (2013.01); *B29C 66/91411* (2013.01); *B29C 66/91935* (2013.01); *C09J 5/06* (2013.01); *H05K 3/1258* (2013.01); *H05K 3/4664* (2013.01); *B29C 66/71* (2013.01); *B29C 66/73115* (2013.01); *B29C 2791/009* (2013.01); *B29K 2105/0079* (2013.01); *B29L 2031/3425* (2013.01); *C09J 2203/326* (2013.01); *C09J 2205/31* (2013.01); *C09J 2400/226* (2013.01); *H05K 3/0032* (2013.01); *H05K 3/1208* (2013.01); *H05K 3/465* (2013.01); *H05K 2201/0129* (2013.01); *Y10T 428/24851* (2015.01)

(58) Field of Classification Search
  CPC .............. B29C 66/41; B29C 66/73921; B29C 66/91411; B29C 66/91935; C08J 7/123; C09J 5/06
  USPC .................................................... 156/272.2
  See application file for complete search history.

(56) References Cited

U.S. PATENT DOCUMENTS

2011/0033976 A1* 2/2011 Di Cioccio ............ H01L 24/24
                                                          438/107
2012/0312583 A1 12/2012 Suzuki et al.

FOREIGN PATENT DOCUMENTS

| JP | 2010-103269 A | 5/2010 |
| JP | 2013-016773 A | 1/2013 |
| JP | 2013-211349 A | 10/2013 |
| JP | 2014-027265 A | 2/2014 |
| TW | 201401951 A | 1/2014 |

OTHER PUBLICATIONS

JP 2010/068755, English machine translation, Apr. 2010.*
JP 2010/068755, English abstract, Apr. 2010.*

* cited by examiner

MULTILAYER WIRING BOARD AND MANUFACTURING METHOD FOR THE MULTILAYER WIRING BOARD

INCORPORATION BY REFERENCE

The disclosure of Japanese Patent Application No. 2014-111182 filed on May 29, 2014 including the specification, drawings and abstract is incorporated herein by reference in its entirety.

BACKGROUND OF THE INVENTION

1. Field of the Invention

The invention relates to a multilayer wiring board and a manufacturing method for the multilayer wiring board.

2. Description of Related Art

In commonly-used multilayer wiring boards, a pattern of traces is formed by applying etching to copper foil bonded to a resin board. However, such multilayer wiring boards are not suitable for use under high current conditions, because the thickness of copper foil used in the multilayer wiring boards is limited.

Japanese Patent Application Publication No. 2013-211349 (JP 2013-211349 A) describes a multilayer wiring board in which a pattern of traces is provided by forming grooves on a resin board and filling the grooves with conductive paste. In this multilayer wiring board, it is possible to form a thicker wiring layer by increasing the depth of each groove. Thus, the multilayer wiring board described in JP 2013-211349 A is more suitable for use under high current conditions than the aforementioned commonly-used multilayer wiring boards. Electric currents, which are higher than electric currents to be applied to commonly-used home electric appliances, need to be applied to in-vehicle multilayer wiring boards. Therefore, there have been demands for in-vehicle multilayer wiring boards having a thicker wiring layer.

According to the technique described in JP 2013-211349 A, a plurality of thermoplastic resin boards, in which traces are formed in the grooves, is heated to a temperature equal to or higher than the softening temperature thereof, and thus the thermoplastic resin boards are bonded together under pressure. In other words, during the thermocompression bonding, the thermoplastic resin boards are entirely softened. This causes a possibility that the grooves will be deformed and thus the traces will fail to obtain desired electrical characteristics.

SUMMARY OF THE INVENTION

The invention provides a multilayer wiring board and a manufacturing method for the multilayer wiring board.

A manufacturing method for a multilayer wiring board according to a first aspect of the invention includes: forming a groove on a surface of a first thermoplastic resin board; forming a modified layer made of resin having a melting point lower than a melting point of resin constituting the first thermoplastic resin board, by applying light to a region of the surface of the first thermoplastic resin board other than a region around the groove; filling the groove of the first thermoplastic resin board with conductive material having fluidity; and bonding a second thermoplastic resin board to the surface of the first thermoplastic resin board, on which the modified layer is formed, by thermocompression bonding.

In the manufacturing method according to the first aspect of the invention, the modified layer, which is made of resin having a melting point lower than the melting point of the resin constituting the first thermoplastic resin board, is formed on the surface of the first thermoplastic resin board. However, the modified layer is not formed in the region around the groove of the first thermoplastic resin board. Thus, when the second thermoplastic resin board is bonded to the surface of the first thermoplastic resin board by thermocompression bonding, deformation of the groove is inhibited.

In the first aspect of the invention, the second thermoplastic resin board may be heated to a temperature that is higher than the melting point of the resin constituting the modified layer and that is lower than the melting point of the resin constituting the first thermoplastic resin board, in the thermocompression bonding.

In the first aspect of the invention, the groove may be formed by repeatedly applying ultraviolet laser light having a wavelength of 250 nm or less and having power of 1 W or less per appliance of light. In this way, the surface of the groove is made hydrophilic.

Further, the modified layer may be formed by applying ultraviolet laser light used as the light. In this way, the groove and the modified layer can be simultaneously formed. Furthermore, the modified layer may be formed by applying the ultraviolet laser light used as the light only once.

A multilayer wiring board according to a second aspect of the invention includes a first thermoplastic resin board, a second thermoplastic resin board, and a modified layer. The first thermoplastic resin board has a surface on which a groove is formed. The trace is formed in the groove. The second thermoplastic resin board is laminated on the surface of the first thermoplastic resin board. The modified layer is formed on a region of an interface between the first thermoplastic resin board and the second thermoplastic board other than a region around the groove. The modified layer is made of resin having a melting point lower than a melting point of resin constituting the first thermoplastic resin board.

In the multilayer wiring board according to the second aspect of the invention, the modified layer is not formed in the region around the groove of the first thermoplastic resin board. Thus, when the second thermoplastic resin board is bonded to the surface of the first thermoplastic resin board by thermocompression bonding, deformation of the groove is inhibited.

As described above, the first aspect of the invention provides the manufacturing method that reduces the occurrence of deformation of the groove due to the thermocompression bonding. The second aspect of the present invention provides the multilayer wiring board in which deformation of the groove due to the thermocompression bonding is reduced.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, example embodiments of the invention will be described in detail with reference to the accompanying drawings. However, the invention is not limited to the following embodiments. The following description and the accompanying drawings will be simplified as appropriate in order to provide a clear explanation.

Figure 1:
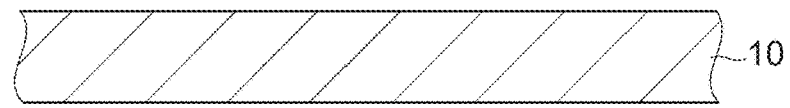
FIG. 1 is a sectional view illustrating a manufacturing method for a multilayer wiring board according to a first embodiment of the invention.
Figure 2:
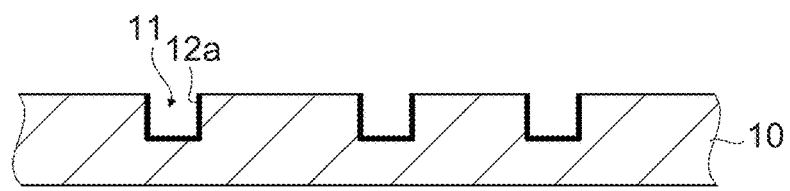
FIG. 2 is a sectional view illustrating the manufacturing method according to the first embodiment of the invention.
Figure 3:
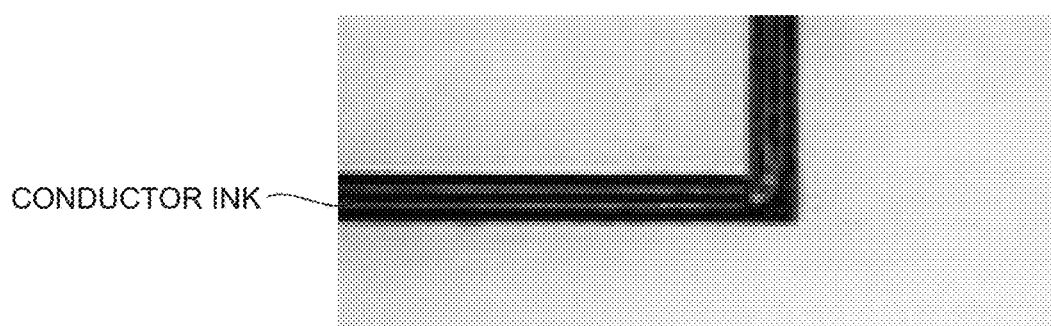
FIG. 3 is a photomicrograph illustrating a state where a trace groove of a first board according to the first embodiment of the invention is filled with conductive ink.
Figure 4:
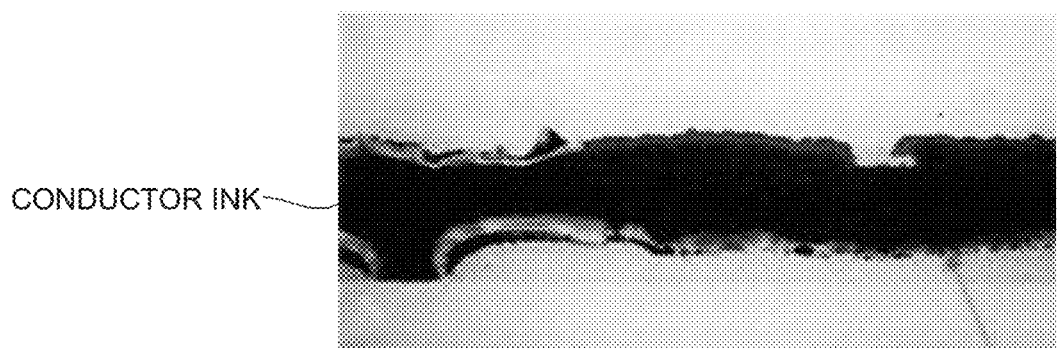
FIG. 4 is a photomicrograph illustrating a state where a trace groove of a first board according to a comparative example is filled with conductive ink.
Figure 5:
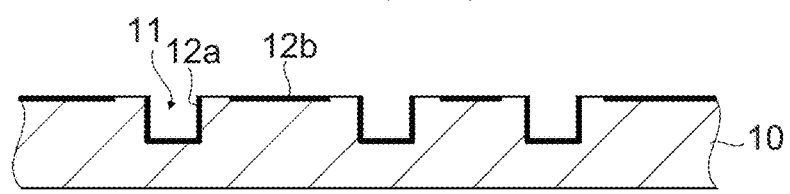
FIG. 5 is a sectional view illustrating the manufacturing method according to the first embodiment of the invention.
Figure 6:
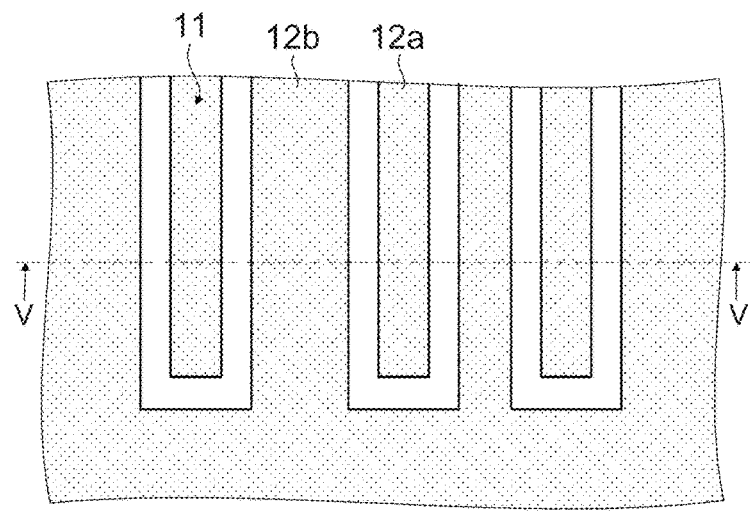
FIG. 6 is a plan view corresponding to FIG. 5.

With reference to FIG. 1 to FIG. 9, a manufacturing method for a multilayer wiring board according to a first embodiment of the invention will be described. FIG. 1, FIG. 2, FIG. 5, and FIG. 7 to FIG. 9 are sectional views illustrating the manufacturing method according to the first embodiment. FIG. 3 is a photomicrograph illustrating a state where a trace groove of a first board according to the first embodiment of the invention is filled with conductive ink. FIG. 4 is a photomicrograph illustrating a state where a trace groove of a first board according to a comparative example is filled with conductive ink. FIG. 6 is a plan view corresponding to FIG. 5.

First, as illustrated in FIG. 1, a flat first board 10 made of thermoplastic resin such as liquid crystal polymer resin, polyimide resin, polyamide-imide resin, or polyether ether ketone resin is prepared. The thickness of the first board 10 is, for example, about 30 μm to 300 μm.

Next, a first surface of the first board 10 is repeatedly subjected to scantling while laser light is applied to the first surface, whereby trace grooves 11 are formed as illustrated in FIG. 2. In an example illustrated in FIG. 2, three trace grooves 11 are formed. The depth of each trace groove 11 is, for example, about 20 μm to 200 μm. As the laser light, low-power ultraviolet laser light having a wavelength of 250 nm or less is preferably used. Specifically, an excimer laser having power of 1 W or less per scan is preferably used. Under such conditions, the first surface of the first board 10 is cut by, for example, about 0.3 μm per scan. Thus, in order to form each trace groove 11 having a depth of 30 μm the first surface of the first board 10 is subjected to scanning about 100 times, for example.

By using the ultraviolet laser light having a wavelength of 250 nm or less and having power of 1 W or less per scan, a hydrophilic modified layer 12a is formed on the surface (the side walls and the bottom surface) of each trace groove 11. Thus, when the trace grooves 11 are filled with conductive ink in a step performed later, the conductive ink spreads into every corner of each trace groove 11. As a result, traces 13 (see FIG. 7) that conform to the shapes of the trace grooves 11 are formed. Further, the adhesion between the trace grooves 11 and the traces 13 is improved. FIG. 3 illustrates a state where the trace groove 11 (having a width of 50 μm) having a surface on which the hydrophilic modified layer is formed is filled with the conductive ink. The trace groove 11 has satisfactory wettability, and thus the conductive ink spreads to conform to the shape of the trace groove 11.

On the other hand, when the wavelength of laser light is longer than 250 nm, or when the power of laser light per scan is greater than 1 W, the hydrophilic modified layer 12a is not formed and the surface of the trace groove 11 is carbonized. Once the surface of the trace groove 11 is carbonized, it is difficult to make the surface of the trace groove 11 hydrophilic. FIG. 4 illustrates a state where a trace groove (having a width of 50 μm) having a carbonized surface is filled with conductive ink. The wettability of the trace groove is poor, and thus the conductive ink fails to spread to conform to the shape of the trace groove.

Next, the first surface of the first board 10, on which the trace grooves 11 are formed, is subjected to scanning only once while laser light is applied to the first surface, whereby a modified layer 12b is formed as illustrated in FIG. 5. The same laser light as that used to form the trace grooves 11 is preferably used. In this case, it is possible to simultaneously form the trace grooves 11 illustrated in FIG. 2 and the modified layer 12b illustrated in FIG. 5.

The modified layer 12b is a film similar to the modified layers 12a, and is hydrophilic. Specifically, due to the laser light application, bonds between polymers in the resin constituting the modified layers 12a and the modified layer 12b are broken, and thus the melting point of the resin constituting the modified layers 12a, 12b is lower than the melting point of the resin constituting the first board 10. For example, if a board made of liquid crystal polymer resin having a melting point of 300° C. is modified in the aforementioned manner, the melting point is reduced by about 10° C. Meanwhile, a hydrophilic group such as a hydroxyl group is bonded to the broken portions. Thus, the modified layers 12a and the modified layer 12b are hydrophilic.

FIG. 6 is a plan view corresponding to FIG. 5. In other words, FIG. 5 is a sectional view taken along the line V-V in FIG. 6. As illustrated in FIG. 5 and FIG. 6, the modified layer 12b formed on the first surface of the first board 10 is not formed in regions around the trace grooves 11. Specifically, the distance between each trace groove 11 and the modified layer 12b is preferably equal to or greater than 10 μm, and is, for example, about 50 μm. The effects of this configuration will be described later.

The number of times of laser light scanning performed to form the modified layer 12b may be two or more. However, as described above, the first surface of the first board 10 is cut by, for example, 0.3 μm per scan. Therefore, the number of times of laser light scanning is preferably as small as possible, and most preferably one.

Figure 7:
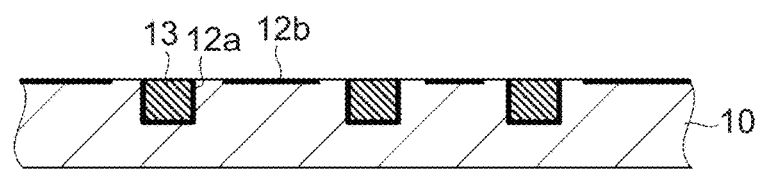
FIG. 7 is a sectional view illustrating the manufacturing method according to the first embodiment of the invention.

Next, the entirety of each trace groove 11 is filled with conductive ink containing fine particles of silver, copper, or the like and then the conductive ink is dried, whereby the traces 13 are formed in the trace grooves 11 as illustrated in FIG. 7. Because the hydrophilic modified layers 12a are formed on the surfaces of the trace grooves 11, the conductive ink spreads into every corner of each trace groove 11. When it is not possible to supply a required amount of conductive ink into the trace grooves 11 at one time, the conductive ink may be supplied again into the trace grooves 11 after the conductive ink first supplied is dried. The modified layer 12b may be formed after the formation of the traces 13 instead of being formed before the formation of the traces 13.

Figure 8:
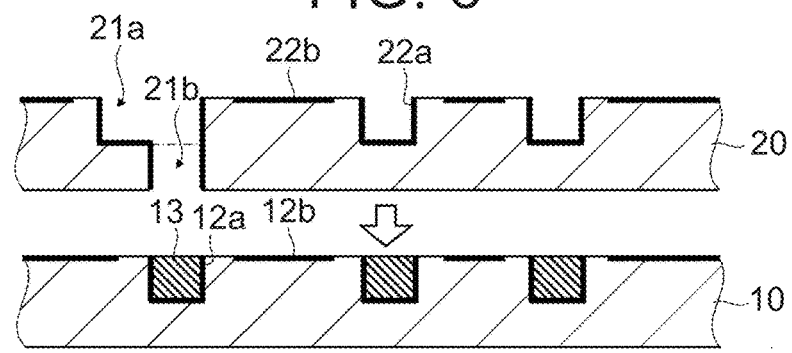
FIG. 8 is a sectional view illustrating the manufacturing method according to the first embodiment of the invention.

Next, as illustrated in FIG. 8, a second surface of a second board 20 is laminated on the first surface of the first board 10. Trace grooves 21a and a via hole 21b are formed on a first surface of the second board 20. The trace grooves 21a and the via hole 21b are formed in the same manner as that for forming the trace grooves 11 of the first board 10. Thus, modified layers 22a are formed on the surface (the side walls and the bottom surface) of each trace groove 21a and on the peripheral wall surface of the via hole 21b. Further, a modified layer 22b is formed on the first surface of the second board 20. The modified layer 22b is formed in the same manner as that for forming the modified layer 12b of the first board 10.

Figure 9:
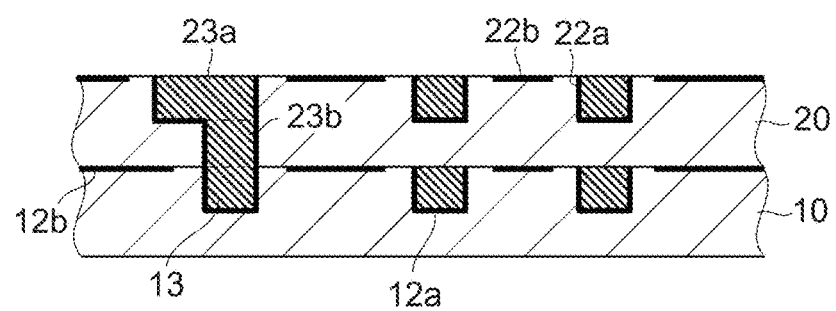
FIG. 9 is a sectional view illustrating the manufacturing method according to the first embodiment of the invention.

Next, the trace grooves 21a and the via hole 21b of the second board 20 are filled with the conductive ink and then the conductive ink is dried, whereby traces 23a and a buried via 23b are formed respectively in the trace grooves 21a and the via hole 21b as illustrated in FIG. 9. Because the hydrophilic modified layers 22a are formed on the surfaces of the trace grooves 21a and the surface of the via hole 21b, the conductive ink spreads into every corner of each of the trace grooves 21a and the via hole 21b. Note that, in order to form thick traces, a large-diameter via hole, large lands (not illustrated in the drawings), or the like, it is preferable to use conductive ink (also referred to as "conductive paste") having a high viscosity and containing conductive material at a high volume ratio.

Then, a third board and the subsequent boards are sequentially laminated in the same manner as that for laminating the second board 20 on the first board 10. After that, all the boards are bonded together at one time through thermocompression bonding. In this way, a multilayer wiring board is manufactured. At the time of thermocompression bonding, the boards are heated to a temperature that is higher than the melting point of the resin constituting the modified layer 12b and the modified layer 22b formed between the boards and that is lower than the melting point of the thermoplastic resin constituting the boards such as the first board 10 and the second board 20.

Thus, at the time of thermocompression bonding, the first board 10 and the second board 20 are not melted and only the modified layer 12b and the modified layer 22b formed between the boards are melted. The modified layer 12b and the modified layer 22b, which are melted at the time of thermocompression bonding, are not formed in the regions around the trace grooves 11, the trace grooves 21a, and the via hole 21b. As a result, at the time of thermocompression bonding, it is possible to effectively reduce the occurrence of deformation of the trace grooves 11, the trace grooves 21a, the via hole 21b, and the like. The modified layers 12b, 22b between the boards are solidified after being once melted. Therefore, the modified layers 12b, 22b remain in the manufactured multilayer wiring board.

Figure 10:
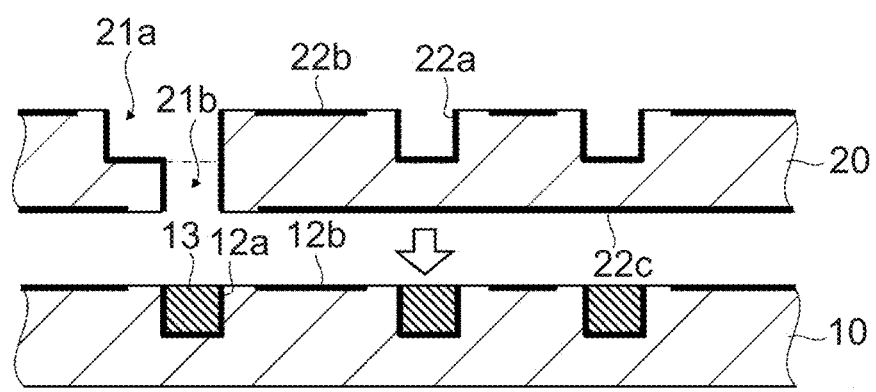
FIG. 10 is a modified example of the manufacturing method illustrated in FIG. 8.

Next, with reference to FIG. 10 and FIG. 11, other embodiments of the invention will be described. FIG. 10 is a modified example of the manufacturing method illustrated in FIG. 8. As illustrated in FIG. 10, before the second surface of the second board 20 is laminated on the first surface of the first board 10, a modified layer 22c may be formed on the second surface of the second board 20. As in the case where the modified layer 12a is not formed in the regions around the trace grooves 11, the modified layer 22c is not formed in a region around the via hole 21b.

This configuration makes it possible to further improve the adhesion between the boards while effectively reducing the occurrence of deformation of the trace grooves 11, the trace grooves 21a, the via hole 21b and the like at the time of thermocompression bonding as in the first embodiment. The other configurations of this modified example are the same as those in the first embodiment, and thus the description on the other configurations will not be provided below.

Figure 11:
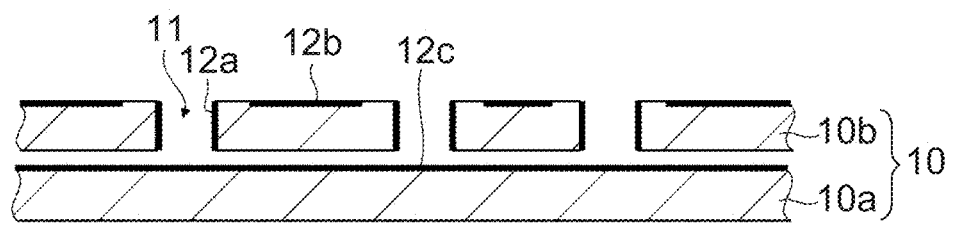
FIG. 11 is a modified example of the first board.

FIG. 11 illustrates a modified example of the first board 10. As illustrated in FIG. 11, two sub-boards, that is, a sub-board 10a and a sub-board 10b may constitute the first board 10 according to the first embodiment. The sub-board 10a is a flat board, and a modified layer 12c is formed on the entirety of a first surface of the sub-board 10a. The modified layer 12c is formed in the same manner as that for forming the modified layer 12b. On the other hand, through-holes are formed in the sub-board 10b. By laminating the sub-board 10b on the sub-board 10a, the trace grooves 11 are formed.

In the modified example illustrated in FIG. 11, the depth of each trace groove 11 is determined by the thickness of the sub-board 10b. Thus, the depth of each trace groove 11 is more easily adjusted in this modified example than in the first embodiment. The other configurations of this modified example are the same as those in the first embodiment, and thus the description on the other configurations will not be provided below.

The invention is not limited to the aforementioned embodiments, and the aforementioned embodiments of the invention may be modified as needed within the scope of the invention. For example, trace grooves, a via hole, and modified layers on a surface of a board may be formed by subjecting the board to one-shot exposure by using a mask and an ultraviolet lamp instead of subjecting the board to laser light scanning. However, in terms of cost, laser light scanning is more advantageous because an expensive mask is unnecessary.

What is claimed is:

1. A manufacturing method for a multilayer wiring board, the manufacturing method comprising:
    forming a groove on a surface of a first thermoplastic resin board;
    forming a modified layer made of resin having a melting point lower than a melting point of resin constituting the first thermoplastic resin board, by applying light to a region of the surface of the first thermoplastic resin board other than a region around the groove;
    filling the groove of the first thermoplastic resin board with conductive material having fluidity; and
    bonding a second thermoplastic resin board to the surface of the first thermoplastic resin board, on which the modified layer is formed, by thermocompression bonding,
    wherein a width in plan view of the region around the groove between the groove and the region of the surface of the first thermoplastic resin board other than the region around the groove is 10 μm or more.

2. The manufacturing method according to claim 1, wherein the second thermoplastic resin board is heated to a temperature that is higher than the melting point of the resin constituting the modified layer and that is lower than the melting point of the resin constituting the first thermoplastic resin board, in the thermocompression bonding.

3. The manufacturing method according to claim 1, wherein the groove is formed by repeatedly applying ultraviolet laser light having a wavelength of 250 nm or less and having power of 1 W or less per appliance of light.

4. The manufacturing method according to claim 3, wherein the modified layer is formed by applying the ultraviolet laser light used as the light.

5. The manufacturing method according to claim 4, wherein the modified layer is formed by applying the ultraviolet laser light used as the light only once.

6. The manufacturing method according to claim 1, wherein a distance between the groove and the modified layer is 10 μm or more.

7. The manufacturing method according to claim 1, wherein a width in plan view of the region around the groove between the groove and the region of the surface of the first thermoplastic resin board other than the region around the groove is 10 μm or more and 50 μm or less.

* * * * *